(12) United States Patent
Ahtikari

(10) Patent No.: US 11,932,131 B2
(45) Date of Patent: Mar. 19, 2024

(54) ELECTRIC VEHICLE CHARGING MONITORING DEVICE AND METHOD

(71) Applicant: Liikennevirta Oy / Virta Ltd, Helsinki (FI)

(72) Inventor: Jussi Ahtikari, Helsinki (FI)

(73) Assignee: Liikennevirta Oy / Virta Ltd, Helsinki (FI)

( * ) Notice: Subject to any disclaimer, the term of this patent is extended or adjusted under 35 U.S.C. 154(b) by 193 days.

(21) Appl. No.: 17/056,523

(22) PCT Filed: May 20, 2020

(86) PCT No.: PCT/FI2020/050337
§ 371 (c)(1),
(2) Date: Nov. 18, 2020

(87) PCT Pub. No.: WO2020/240081
PCT Pub. Date: Dec. 3, 2020

(65) Prior Publication Data
US 2022/0285962 A1 Sep. 8, 2022

(30) Foreign Application Priority Data
May 24, 2019 (FI) .................................. 20195432

(51) Int. Cl.
*H02J 7/00* (2006.01)
*B60L 53/60* (2019.01)
(Continued)

(52) U.S. Cl.
CPC ............... *B60L 53/62* (2019.02); *B60L 53/60* (2019.02); *G01R 19/0092* (2013.01);
(Continued)

(58) Field of Classification Search
CPC ........ B60L 53/60; B60L 53/62; H02J 7/0047; H02J 7/00304; H02H 3/08; G01R 19/0092
(Continued)

(56) References Cited

U.S. PATENT DOCUMENTS

2010/0134067 A1 6/2010 Baxter et al.
2012/0022700 A1 1/2012 Drees et al.
(Continued)

FOREIGN PATENT DOCUMENTS

CN 101834464 A 9/2010
CN 102708427 A 10/2012
(Continued)

OTHER PUBLICATIONS

Office Action in corresponding European patent application No. 20 730 311.6 dated Jul. 9, 2021, eight pages.
(Continued)

*Primary Examiner* — Zixuan Zhou
(74) *Attorney, Agent, or Firm* — Robert M. Siminski (57) ABSTRACT

It is an object to provide an electric vehicle charging monitoring device and an electric vehicle charging monitoring method. According to an embodiment, a device comprises: a current measurement device configured to measure an electrical current flowing from an electrical input to an electrical output and a computing device electrically coupled to the current measurement device, configured to: monitor a number of charging sessions based on the electrical current flow from the electrical input to the electrical output; compare the number of charging sessions to a first preconfigured value; and detect abnormal current flow based on the charging session comparison. A device, a method, and a computer program product are provided.

13 Claims, 3 Drawing Sheets

(51) Int. Cl.
    *B60L 53/62*    (2019.01)
    *G01R 19/00*   (2006.01)
    *H02H 3/08*     (2006.01)

(52) U.S. Cl.
    CPC ............. *H02H 3/08* (2013.01); *H02J 7/0047* (2013.01); *H02J 7/00304* (2020.01)

(58) Field of Classification Search
    USPC .................................. 320/106, 109; 701/22
    See application file for complete search history.

(56) References Cited

U.S. PATENT DOCUMENTS

| | | |
|---|---|---|
| 2012/0181982 A1 | 7/2012 | Fecher |
| 2012/0274287 A1 | 11/2012 | Ree et al. |
| 2012/0280653 A1 | 11/2012 | Prosser et al. |
| 2013/0234664 A1* | 9/2013 | Marus .................... B60L 50/62 320/109 |
| 2014/0062401 A1 | 3/2014 | Gadh et al. |

FOREIGN PATENT DOCUMENTS

| | | |
|---|---|---|
| CN | 202795574 U | 3/2013 |
| CN | 106657302 A | 5/2017 |
| CN | 207164151 U | 3/2018 |
| CN | 108767952 A | 11/2018 |
| CN | 109515243 A | 3/2019 |
| CN | 109743224 A | 5/2019 |
| DE | 102011010319 A1 | 8/2012 |
| WO | WO-2014044328 A1 | 3/2014 |

OTHER PUBLICATIONS

Harrou Fouzi et al "Reliable fault detection and diagnosis of photovoltaic systems based on statistical monitoring approaches", Renewable Energy, Pergamon Press, Oxford, GB, vol. 116, pp. 22-37 (Sep. 17, 2017).

International Search Report of the International Searching Authority, issued in PCT/FI2020/050337, dated Sep. 9, 2020; ISA/EP.

Search Report from corresponding Finnish Application No. 20195432 dated Dec. 12, 2019.

Widzinska, Joanna et al., "Challenges to the Polish Power System due to the Impementation of Electric Vehicles", 2018 Progress in Applied Electrical Engineering (PAEE), IEEE, Jun. 18, 2018, pp. 1-9, XP033390812, DOI: 10.1109/PAEE.2018.8441165.

Office Action dated Oct. 21, 2022 in corresponding European Patent Application No. 20730311.6.

Chinese Office Action regarding Patent Application No. 202080004064.2, dated Jul. 5, 2023.

* cited by examiner

ELECTRIC VEHICLE CHARGING MONITORING DEVICE AND METHOD

CROSS-REFERENCE TO RELATED APPLICATIONS

This application is a 371 U.S. National Phase of International Application No. PCT/FI2020/050337, filed May 20, 2020, which claims priority to Finnish Patent Application No. 20195432, filed May 24, 2019. The entire disclosures of the above applications are incorporated herein by reference.

TECHNICAL FIELD

The present disclosure relates to electric vehicle charging, and more particularly to a charging monitoring device and method.

BACKGROUND

When the number of electric vehicle (EV) charging stations grows, their effect on electrical grids becomes larger. At the same time, the security of charging station hardware may require improvements. If an attacker or a malicious user could take over a big network of charging stations and control the charging of a large number of EVs, the attack could have a significant adverse effect on the electrical grid. For example, the attacker could switch on and off the charging of a large number of charging stations in a synchronized manner. Such fast variation in the electrical load of the grid could have serious adverse effects on many components in the electrical grid.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object to provide an electric vehicle charging monitoring device and an electric vehicle charging monitoring method. The foregoing and other objects are achieved by the features of the independent claims. Further implementation forms are apparent from the dependent claims, the description and the figures.

According to a first aspect, a device for monitoring electric vehicle charging comprises: an electrical input; an electrical output; a current measurement device, configured to measure an electrical current flowing from the electrical input to the electrical output; and a computing device electrically coupled to the current measurement device, configured to: monitor a number of charging sessions based on the electrical current flow from the electrical input to the electrical output; compare the number of charging sessions to a first preconfigured value; and detect abnormal current flow based on the charging session comparison. With such configurations, the device can, for example, detect malicious use of a charging station connected to the device.

In an implementation form of the first aspect, the first preconfigured value comprises a number of charging sessions per a time interval. With such configurations, the device can, for example, detect malicious use where a charging session is started and stopped repeatedly.

In a further implementation form of the first aspect, the computing device is further configured to: monitor an amplitude of the electrical current flow from the electrical input to the electrical output; compare the amplitude to a second preconfigured value; and detect abnormal current flow based on the amplitude comparison. With such configurations, the device can, for example, detect malicious use causing abnormally high current flow through the device.

In a further implementation form of the first aspect, the device further comprises a switch electrically arranged between the electrical input and the electrical output, wherein the computing device is electrically coupled to the switch, and wherein the computing device is further configured to: in response to detecting abnormal current flow, open the switch. With such configurations, the device can, for example, detect and prevent malicious use of a charging station connected to the device.

In a further implementation form of the first aspect, the first preconfigured value comprises an alert limit, and wherein the computing device is further configured to: in response to the number of charging sessions being greater than the alert limit, transmit an alert to a backend device; and in response to the number of charging sessions being greater than an emergency limit, open the switch.

In a further implementation form of the first aspect, the emergency limit is greater than the alert limit.

In a further implementation form of the first aspect, the computing device is further configured to close the switch after a preconfigured time interval has passed from the detection. With such configurations, the device can, for example, detect malicious use of a charging station connected to the device, and then enable normal operation of the charging station after the preconfigured time interval.

In a further implementation form of the first aspect, the computing device is further configured to, in response to detecting abnormal current flow, transmit an alert to a backend device via a data connection. With such configurations, the device can, for example, detect malicious use of a charging station connected to the device and report the malicious use to the backend device.

In a further implementation form of the first aspect, the alert comprises at least one of: an identification of the device; a time of the detection; the number of charging sessions; the amplitude of the electrical current flow; the first preconfigured value; or the second preconfigured value. With such configurations, the device can, for example, detect malicious use of a charging station connected to the device and provide additional information to the backend device so that the backend device can, for example, identify the device and/or analyze other information provided by the device.

In a further implementation form of the first aspect, the computing device is further configured to: receive the first preconfigured value, the second preconfigured value, and/or the emergency limit from a backend device via a data connection. With such configurations, the device can, for example, receive configurations remotely so that the device can be configured remotely.

In a further implementation form of the first aspect, the computing device is further configured to: calculate the first preconfigured value and/or the second preconfigured value based on the monitored electrical current flow. With such configurations, the device can, for example, calculate the first preconfigured value based on normal use of a charging station connected to the device. Thus, the device can adapt to the normal use of the charging station and detect abnormal use based on a deviation from the normal use.

In a further implementation form of the first aspect, the computing device is further configured to calculate the first preconfigured value and/or the second preconfigured value using at least one of: linear regression; decision forest; boosted decision tree; fast forest quantile; neural network; or Poisson regression. With such configurations, the device can, for example, calculate the first preconfigured value so that it reflect well the normal use of the charging station.

According to a second aspect, a method comprises: measuring an electrical current flowing from an electrical input to an electrical output; monitoring a number of charging sessions based on the electrical current flow from the electrical input to the electrical output; comparing the number of charging sessions to a first preconfigured value; and detecting abnormal current flow based on the charging session comparison.

According to a third aspect, a computer program product is provided, comprising program code configured to perform a method according to the second aspect when the computer program is executed on a computer.

It is to be understood that the implementation forms of the second aspect described above may be used in combination with each other. Several of the implementation forms may be combined together to form a further implementation form.

Many of the attendant features will be more readily appreciated as they become better understood by reference to the following detailed description considered in connection with the accompanying drawings.

DESCRIPTION OF THE DRAWINGS

In the following, example embodiments are described in more detail with reference to the attached figures and drawings, in which.

In the following, identical reference signs refer to identical or at least functionally equivalent features.

DETAILED DESCRIPTION

In the following description, reference is made to the accompanying drawings, which form part of the disclosure, and in which are shown, by way of illustration, specific aspects in which the present disclosure may be placed. It is understood that other aspects may be utilized and structural or logical changes may be made without departing from the scope of the present disclosure. The following detailed description, therefore, is not to be taken in a limiting sense, as the scope of the present disclosure is defined be the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. On the other hand, for example, if a specific apparatus is described based on functional units, a corresponding method may include a step performing the described functionality, even if such step is not explicitly described or illustrated in the figures. Further, it is understood that the features of the various example aspects described herein may be combined with each other, unless specifically noted otherwise.

Figure 1:
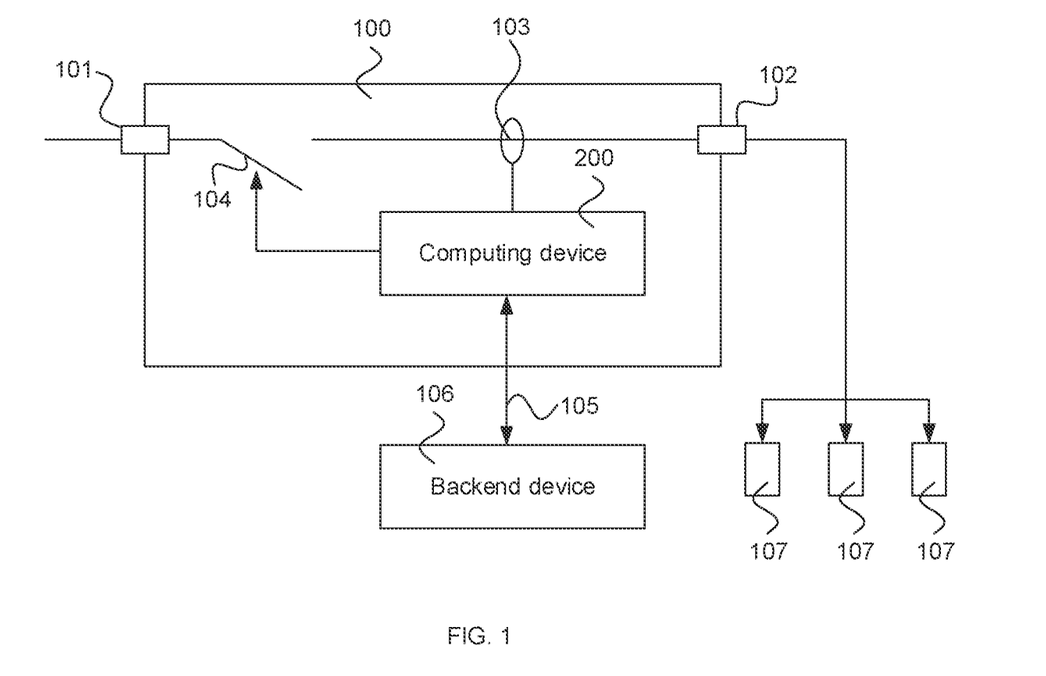
FIG. 1 illustrates a schematic representation of a system comprising a device configured for charging monitoring according to an embodiment.

FIG. 1 illustrates a schematic representation of a device 100 for monitoring electric vehicle charging according to an embodiment. The device 100 may also be used in monitoring charging in other applications, such as building battery pack charging monitoring.

According to an embodiment, a device 100 for monitoring electric vehicle charging comprises an electrical input 101 and an electrical output 102. The device 100 may further comprise a current measurement device 103. The current measurement device 103 may be configured to measure an electrical current flowing from the electrical input 101 to the electrical output 102. The device may further comprise a computing device 200. The computing device 200 may be electrically coupled to the current measurement device 103. The computing device 200 may be configured to monitor a number of charging sessions based on the electrical current flow from the electrical input 101 to the electrical output 102. The computing device 200 may be further configured to compare the number of charging sessions to a first preconfigured value. The computing device 200 may be further configured to detect abnormal current flow based on the charging session comparison.

The electrical input 101 may comprise a connector for connecting the device 100 to a power source. Thus, the electrical input 101 may be electrically coupled to a power source. The power source may be, for example, an electrical grid.

The electrical output 102 may comprise a connector for connecting the device 100 to one or more charging stations 107. Thus, the electrical output 102 may be electrically coupled to one or more charging stations 107. The charging stations 107 may be configured to charge, for example, electric vehicles. Due to the connectors, a user may connect the device 100 into a pre-existing charging system, such as a private or a public charging system.

The current measurement device 103 may comprise, for example, any device that is configured to sense electrical current. The current measurement device 103 may for example comprise a sensor that is configured to sense an electrical current based on Faraday's law. The current measurement device 103 may comprise, for example, a current transformer or a Rogowski coil. Alternatively or additionally, the current measurement device 103 may sense the electrical current based on a magnetic field generated by the current. The current measurement device 103 may comprise, for example, a Hall effect sensor, a flux gate sensor, or a magneto-resistive current sensor. The operating principle of the current measurement device 103 may depend on whether the current to be sensed is an alternating current (AC) or a direct current (DC). The current measurement device 103 may also be referred to as a current sensor or similar.

The current measurement device 103 may convert the electrical current into an electrical voltage. The current measurement device 103 may further comprise an analog-to-digital converter (ADC) that may be configured to convert the analog voltage/current generated by the current measurement device 103 into a digital signal. Alternatively, the ADC may be a separate device from the current measurement device 103. The digital signal may be detected by the computing device 200.

All electricity to the charging stations 107 may flow through the device 100. Thus, the device 100 can monitor the current flow independently of the charging stations 107. If the device 100 notices any abnormality in the usage of the charging stations 107 via the current flow through the device 100, the device 100 may, for example, send a warning to the backend device 106 and/or shut down the all the charging stations 107 by opening the switch 104. Thus, the device 100 does not need to rely on remote monitoring and administration. If, for example, an attacker prevented or faked traffic from the device 100 to a backend system, such as the backend device 106, the device 100 would still be able to function properly.

The device 100 may be a stand-alone device or it may be integrated into, for example, a charging device. The device 100 may monitor the current flow and detect abnormal charging independently.

The backend device 106 may be connected to the device 100 and/or the computing device 200 via the data connection 105. The backend device 106 can set different parameters to the device 100. These parameters may comprise, for example, alert or emergency stop limits.

The computing device 200 may communicated with the backend device 106 via a data connection 105. The data connection 105 may be any connection that enables the device 100 to communicate with the backend device 106. The data connection 105 may comprise, for example, internet, Ethernet, 3G, 4G, long-term evolution (LTE), new radio (NR), Wi-Fi, or any other wired or wireless connections or some combination of these. For example, the data connection 105 may comprise a wireless connection, such as Wi-Fi, an internet connection, and an Ethernet connection.

The computing device 200 can perform different actions based on the current flow from the electrical input 101 to the electrical output 102.

The computing device 200 can keep a connection open to backend device 106, so that the backend device 106 can monitor if the device 100 is online and working.

The backend device 106 may be configured to receive alerts from the device 100. The backend device 106 may also fetch statistics data, such as energy usage, from the device 100.

The backend device 106 may also monitor if it has an open connection to the device 100. If the connection is lost the backend device 106 can send an alert to an administrator. Alternatively or additionally, in response to losing connection to the backend device 106, the computing device 200 can store some information into the memory 202. Such information may comprise, for example, number of charging sessions and time they happened. When the computing device 200 is again connected to the backend device 106, the computing device 200 can transmit the information to backend device 106.

The backend device 106 may comprise any computing apparatus. The backend device 106 may comprise, for example, a server or a plurality of servers.

The backend device 106 may comprise at least one processor. The at least one processor may comprise, for example, one or more of various processing devices, such as a co-processor, a microprocessor, a controller, a digital signal processor (DSP), a processing circuitry with or without an accompanying DSP, or various other processing devices including integrated circuits such as, for example, an application specific integrated circuit (ASIC), a field programmable gate array (FPGA), a microcontroller unit (MCU), a hardware accelerator, a special-purpose computer chip, or the like.

The backend device 106 may further comprise a memory. The memory may be configured to store, for example, computer programs and the like. The memory may comprise one or more volatile memory devices, one or more non-volatile memory devices, and/or a combination of one or more volatile memory devices and non-volatile memory devices. For example, the memory may be embodied as magnetic storage devices (such as hard disk drives, floppy disks, magnetic tapes, etc.), optical magnetic storage devices, and semiconductor memories (such as mask ROM, PROM (programmable ROM), EPROM (erasable PROM), flash ROM, RAM (random access memory), etc.).

As a person skilled in the art can appreciate, when the backend device 106 is configured to implement some functionality, some component and/or components of the backend device 106, such as the at least one processor and/or the memory, may be configured to implement this functionality. Furthermore, when the at least one processor is configured to implement some functionality, this functionality may be implemented using program code comprised, for example, in the memory.

According to an embodiment, the first preconfigured value comprises a number of charging sessions per a time interval. The first preconfigured value may comprise, for example, an alert limit and/or an emergency limit. For example, the first preconfigured value may comprise a maximum number of charging sessions per a time interval. The time interval may be, for example, a minute, an hour, or a day. The computing device 200 may, for example, compare if the number of charging sessions is greater than the maximum number of charging sessions per time interval. The computing device 200 may deduce that the current flow is abnormal, if the number of charging sessions is greater than the maximum number of charging sessions per time interval. Since typical users of the charging stations 107 may be unlikely to cause large numbers of charging sessions per time interval, the computing device 200 may be able to detect, for example, malicious use of the charging stations 107 based on the aforementioned comparison.

According to an embodiment, the computing device 200 may be further configured to monitor an amplitude of the electrical current flow from the electrical input 101 to the electrical output 102. The computing device 200 may be further configured to compare the amplitude to a second preconfigured value and detect abnormal current flow based on the amplitude comparison. For example, the second preconfigured value may comprise a maximum current amplitude. The computing device 200 may, for example, compare if the amplitude of the electrical current flow is greater than the maximum current amplitude. The computing device 200 may deduce that the current flow is abnormal, if the amplitude of the electrical current flow is greater than the maximum current amplitude. Herein, the term "amplitude" may refer to, for example, the absolute value of a DC current, the amplitude of an AC current, the RMS current of an AC current, or similar.

According to an embodiment, the device 100 may further comprise a switch 104 electrically arranged between the electrical input 101 and the electrical output 102. The computing device 200 may be electrically coupled to the switch 104. The computing device 200 may be further configured to in response to detecting abnormal current flow, open the switch 104. When the switch 104 is in an open position, substantially no current can flow through the switch 104. When the switch 104 is in an open position, the electrical output 102 can be substantially electrically disconnected from the electrical input 101. Thus, the device 100 may stop current flow from the electrical input 101 to the electrical output 102 when abnormal current flow is detected. The device 100 may perform this independent of the backend device 106 or any other device.

The switch 104 may comprise, for example, one or more transistors or one or more relays. The computing device 104 may control the switch 104 using, for example, a voltage and/or a current applied to the switch 104.

According to a further embodiment, the computing device 200 is further configured to close the switch 104 after a preconfigured time interval has passed from the detection. When the switch 104 is in a closed position, current can flow through the switch. When the switch 104 is in closed position, the electrical output 102 can be electrically connected to the electrical input 101. Thus, after the preconfigured time interval, the charging stations 107 may continue normal operation.

According to an embodiment, the computing device 200 is further configured to, in response to detecting abnormal current flow, transmit an alert to the backend device 106 via the data connection 105. For example, the alert may comprise at least one of: an identification of the device, a time of the detection, the number of charging sessions, the amplitude of the electrical current flow, the first preconfigured value; or the second preconfigured value. The alert may also comprise any other information. Based on the alert, the backend device 106 may, for example, identify the device 100 and monitor operation of the device 100. For example, if a single device 100 transmits multiple alerts in a short period of time, the backend device 106 may notify an administrator so that the device 100 can be, for example, examined physically. Alternatively or additionally, the backend device 106 may analyze the information in the alert and deduce a cause for the alerts. For example, the device 100 may be malfunctioning or a malicious user may be performing an attack on the device 100.

The device 100 may be configured to open the switch 104 and transmit the alert to the backend device 106 according to different preconfigured values. For example, the device 100 may be configured to open the switch 104 when the number of charging sessions per time interval is greater than an emergency stop limit. The device 100 may also be configured to transmit the alert when the number of charging sessions per time interval is greater than an alert limit. The first and/or the second preconfigured value may correspond to the emergency stop limit and/or the alert limit. In some embodiments, the emergency stop limit and the alert limit may be equal.

According to an embodiment, the first preconfigured value comprises an alert limit. The computing device 200 may be further configured to, in response to the number of charging sessions being greater than the alert limit, transmit an alert to a backend device 106. The computing device 200 may further be configured to, in response to the number of charging sessions being greater than an emergency limit, open the switch 104.

According to an embodiment, the emergency limit is greater than the alert limit. For example, the alert limit may be two charging sessions per hour and the emergency limit may be 100 charging sessions per hour. The device 100 may determine/obtain the alert limit and/or the emergency limit using any procedure disclosed herein for the first preconfigure value and/or for the second preconfigured value.

According to an embodiment, the computing device 200 is further configured to receive the first preconfigured value, the second preconfigured value, and/or the emergency limit from a backend device 106 via a data connection 105. The backend device 106 may use, for example, similar procedures as described herein for the computing device 200 for calculating the first and/or the second preconfigured value. Alternatively or additionally, the backend device 106 may collect information from a plurality of devices 100 and configure the first and/or the second preconfigured value for each device 100 based on the information.

According to another embodiment, the computing device 200 is further configured to calculate the first preconfigured value and/or the second preconfigured value based on the monitored electrical current flow. For example, the computing device 200 may calculate one or more statistical properties of the electrical current flow over time. The computing device 200 may then compare the number of charging sessions per time interval to the statistical properties and deduce if the current flow is abnormal. For example, the computing device 200 may be configured to calculate an average/mean number of charging sessions per time interval based on the monitoring. The computing device 200 may then calculate the first preconfigured value based on the average number of charging sessions per time interval. For example, the first preconfigured value may be equal to a preconfigured scaling factor times the average number of charging sessions per time interval.

Alternatively or additionally, the computing device 200 may calculate a mean and a variance of the number of charging sessions per time interval. The computing device 200 may then calculate the first preconfigured value based on the mean and the variance and, for example, a preconfigured percentile limit.

The computing device 200 may be configured to calculate the first preconfigured value and/or the second preconfigured value using at least one of: linear regression, decision forest, boosted decision tree, fast forest quantile, neural network, or Poisson regression. The computing device 200 may, for example, calculate one or more statistical values, such as those disclosed herein, and using the one or more statistical values, calculate the first or the second preconfigured value using at least one of the procedures disclosed above. Linear regression may work well on, for example, high-dimensional, sparse data sets lacking complexity. Decision trees can be efficient in both computation and memory usage during training and prediction.

Figure 2:
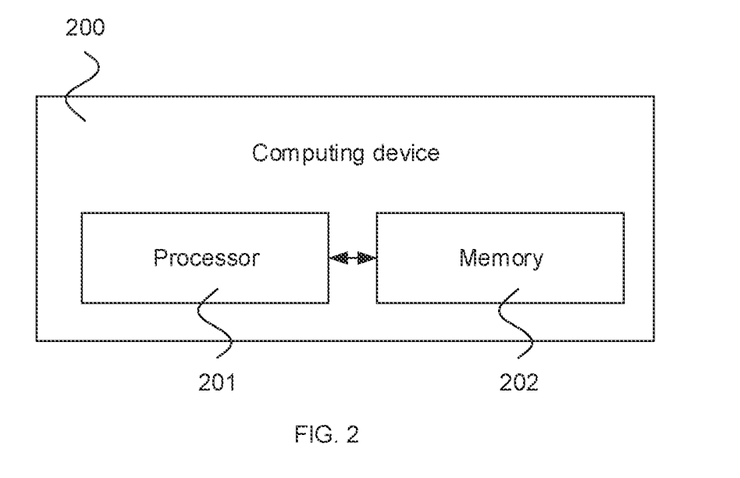
FIG. 2 illustrates a schematic representation of a computing device configured for current flow monitoring according to an embodiment.

FIG. 2 illustrates a schematic representation of the computing device 200 according to an embodiment.

The computing device 200 may comprise at least one processor 201. The at least one processor 201 may comprise, for example, one or more of various processing devices, such as a co-processor, a microprocessor, a controller, a digital signal processor (DSP), a processing circuitry with or without an accompanying DSP, or various other processing devices including integrated circuits such as, for example, an application specific integrated circuit (ASIC), a field programmable gate array (FPGA), a microcontroller unit (MCU), a hardware accelerator, a special-purpose computer chip, or the like.

The computing device 200 may further comprise a memory 202. The memory 202 may be configured to store, for example, computer programs and the like. The memory 202 may comprise one or more volatile memory devices, one or more non-volatile memory devices, and/or a combination of one or more volatile memory devices and non-volatile memory devices. For example, the memory 202 may be embodied as magnetic storage devices (such as hard disk drives, floppy disks, magnetic tapes, etc.), optical magnetic storage devices, and semiconductor memories (such as mask ROM, PROM (programmable ROM), EPROM (erasable PROM), flash ROM, RAM (random access memory), etc.).

When the computing device 200 is configured to implement some functionality, some component and/or components of the computing device 200, such as the at least one processor 201 and/or the memory 202, may be configured to implement this functionality. Furthermore, when the at least one processor 201 is configured to implement some functionality, this functionality may be implemented using program code comprised, for example, in the memory 202.

Figure 3:
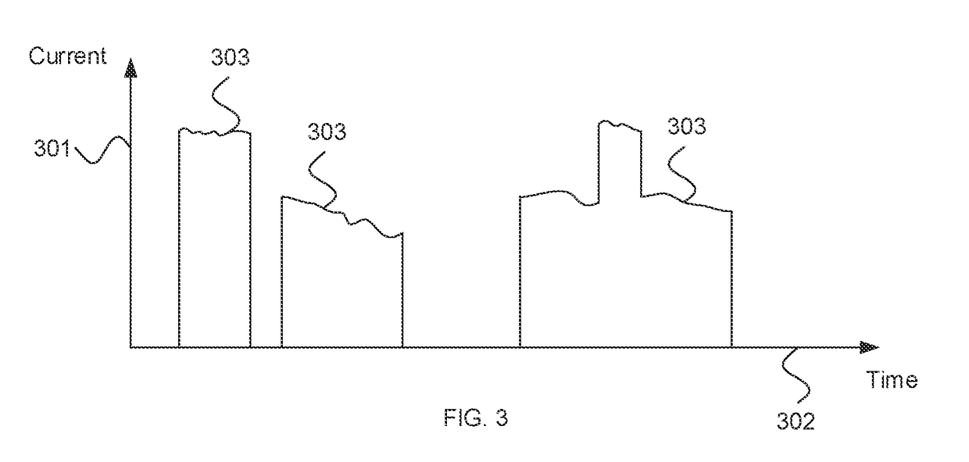
FIG. 3 illustrates a schematic representation of current flow as a function of time according to an embodiment.

FIG. 3 illustrates a schematic representation of a current flow 301 as a function of time 302 according to an embodiment. The embodiment of FIG. 3 comprises various charging sessions 303.

During a charging session 303, the current flow 301 may be non-zero. Outside a charging session 303, the current flow 301 may be substantially zero. The computing device 102 may be configured to detect the charging sessions 303 based on the current flow 301. Alternatively, or additionally, during a charging sessions 303, amplitude of the current flow 301 may be greater than a preconfigured minimum current value. The preconfigured minimum current value may be, for example, 1 microampere, 10 microamperes, 100 microamperes, 1 milliampere, 10 milliamperes, or 100 milliamperes. The computing device 102 may be configured to detect the charging sessions 303 by comparing the current flow 301 to the preconfigured minimum value. The current flow 301 may correspond to electrical current flowing from the electrical input 101 to the electrical output 102.

A charging session 303 may correspond to any period of time when at least one electric vehicle is being charged in the charging stations 107. A charging session 303 may refer to the time period when a single electric vehicle is being charged. Thus, if a plurality electric vehicles are charged simultaneously, there may be a plurality of charging sessions simultaneously, one for each vehicle, for example. For example, during the last charging session 303 presented in the embodiment of FIG. 3, two vehicles may be charged. While a first vehicle may be charging in a first charging station, a second vehicle may start charging in a second starting station. This can be observed as an increase in the current flow 301 during the last charging session 303. This may be regarded as a single charging session or two separate charging sessions that happen to overlap in time.

As can be seen from the embodiment of FIG. 3, the current flow 301 may vary during a charging session 303. For example, as the charge level of a battery of an electric vehicle being charged increases, the charging rate, and therefore the current flow 301, may decrease. The current flow 301 may also vary due to various other factors during a charging session 303.

The current flow 301 may also vary between different charging sessions 303 as can be seen from the embodiment of FIG. 3. The length in time of a charging session 303 may also vary between charging sessions 303.

Figure 4:
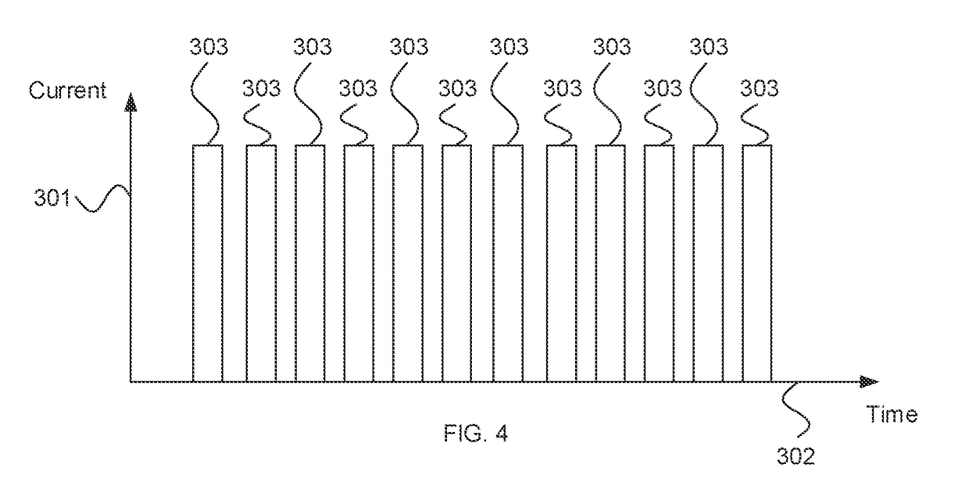
FIG. 4 illustrates a schematic representation of current flow as a function of time according to an embodiment.

FIG. 4 illustrates a schematic representation of a current flow 301 as a function of time 302 according to another embodiment. The time scale of the embodiment of FIG. 4 may not be the same as the same scale of the embodiment of FIG. 3.

The current flow 301 presented in the embodiment of FIG. 4 may be considered abnormal. The device 100 may detect the abnormal current flow 301 based on, for example, the large number of charging sessions 303 per time interval. Alternatively or additionally, the device 100 may detect the abnormal current flow 301 based on, for example, the short duration of the charging sessions 303 and/or short duration of the time interval between the charging sessions 303.

The abnormal current flow 301 may be due to, for example, a malicious user of the charging station.

According to an embodiment, the first preconfigured value comprises a number of charging sessions per a time interval. The number of charging sessions per time interval may comprise, for example, 10 charging sessions per minute, 10 charging sessions per hour, 20 charging sessions per hour, 100 charging sessions per hour, or 1000 charging sessions per hour.

Even though the current flow 301 in the embodiments of FIG. 3 and FIG. 4 may be illustrated as substantially constant, the current flow 301 may not be a direct current (DC). The current flow 301 may be DC or an alternating current (AC). The current flow 301 presented in the embodiments may refer, for example, to a root mean square (RMS) value of an AC current flow.

The current flows presented in the embodiments of FIG. 3 and FIG. 4 are only exemplary and the actual current flow in the device 100 may differ from these. For example, due to physical limitations, such capacitance, the rate of change of the current flow 301 may be limited.

Figure 5:
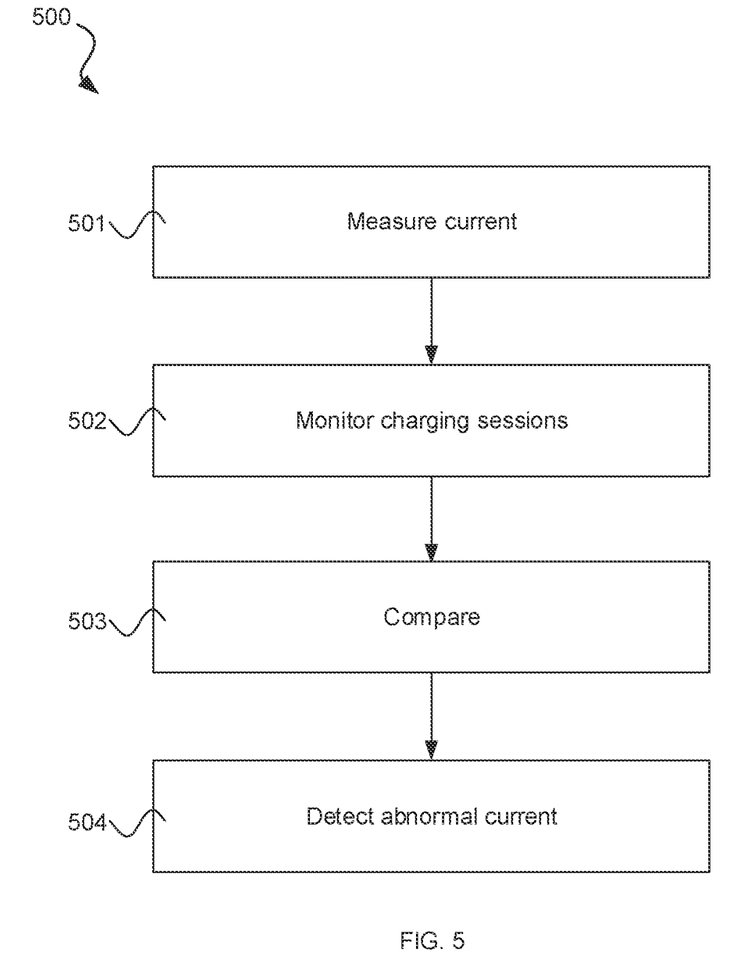
FIG. 5 illustrates a flow chart representation of a method for charging monitoring according to an embodiment.

FIG. 5 illustrates a flow chart representation of a method 500 according to an embodiment.

According to an embodiment, the method 500 comprises measuring 501 an electrical current flowing from an electrical input to an electrical output. The measuring 501 may be performed, for example, by the current measuring device 103.

The method 500 may further comprise monitoring 502 a number of charging sessions based on the electrical current flow from the electrical input to the electrical output. The monitoring 502 may be performed, for example, by the computing device 200.

The method 500 may further comprise comparing 503 the number of charging sessions to a first preconfigured value. The comparing 503 may be performed, for example, by the computing device 200.

The method 500 may further comprise detecting 504 abnormal current flow based on the charging session comparison. The detecting 504 may be performed, for example, by the computing device 200.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A device for monitoring electric vehicle charging, comprising:
   an electrical input;
   an electrical output;
   a current measurement device, configured to measure an electrical current flowing from the electrical input to the electrical output; and
   a computing device electrically coupled to the current measurement device, configured to:
      monitor a number of charging sessions based on the electrical current flow from the electrical input to the electrical output;
      compare the number of charging sessions to a first preconfigured value, wherein the first preconfigured value comprises a maximum number of charging sessions per a time interval; and
      detect abnormal current flow based on the charging session comparison.

2. The device according to claim 1, wherein the computing device is further configured to:
   monitor an amplitude of the electrical current flow from the electrical input to the electrical output;
   compare the amplitude to a second preconfigured value; and
   detect abnormal current flow based on the amplitude comparison.

3. The device according to claim 1, further comprising a switch electrically arranged between the electrical input and the electrical output, wherein the computing device is electrically coupled to the switch, and wherein the computing device is further configured to:
   in response to detecting abnormal current flow, open the switch.

4. The device according to claim 3, wherein the first preconfigured value comprises an alert limit, and wherein the computing device is further configured to:
   in response to the number of charging sessions being greater than the alert limit, transmit an alert to a backend device; and
   in response to the number of charging sessions being greater than an emergency limit, open the switch.

5. The device according to claim 4, wherein the emergency limit is greater than the alert limit.

6. The device according to claim 5, wherein the computing device is further configured to close the switch after a preconfigured time interval has passed from the detection.

7. The device according to claim 1, wherein the computing device is further configured to, in response to detecting abnormal current flow, transmit an alert to a backend device via a data connection.

8. The device according to claim 7, wherein the alert comprises at least one of:
   an identification of the device;
   a time of the detection;
   the number of charging sessions;
   the amplitude of the electrical current flow;
   the first preconfigured value; or
   the second preconfigured value.

9. The device according to claim 1, wherein the computing device is further configured to:
   receive the first preconfigured value, the second preconfigured value, and/or the emergency limit from a backend device via a data connection.

10. The device according to claim 1, wherein the computing device is further configured to:
    calculate the first preconfigured value and/or the second preconfigured value based on the monitored electrical current flow.

11. The device according to claim 1, wherein the computing device is further configured to calculate the first preconfigured value and/or the second preconfigured value using at least one of:
    linear regression;
    decision forest;
    boosted decision tree;
    fast forest quantile;
    neural network; or
    Poisson regression.

12. A method, comprising:
    measuring an electrical current flowing from an electrical input to an electrical output;
    monitoring a number of charging sessions based on the electrical current flow from the electrical input to the electrical output;
    comparing the number of charging sessions to a first preconfigured value, wherein the first preconfigured value comprises a maximum number of charging sessions per a time interval; and
    detecting abnormal current flow based on the charging session comparison.

13. A non-transitory computer readable recording medium that stores computer executable program instructions that, when executed on a computer, causes the computer to execute the method according to claim 12.

* * * * *